United States Patent
Rajaee et al.

(10) Patent No.: US 9,306,553 B2
(45) Date of Patent: Apr. 5, 2016

(54) VOLTAGE LEVEL SHIFTER WITH A LOW-LATENCY VOLTAGE BOOST CIRCUIT

(71) Applicant: QUALCOMM Incorporated, San Diego, CA (US)

(72) Inventors: Omid Rajaee, San Diego, CA (US); Wei Zheng, San Diego, CA (US); Dinesh Jagannath Alladi, San Diego, CA (US); Yuhua Guo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 13/787,590

(22) Filed: Mar. 6, 2013

(65) Prior Publication Data

US 2014/0253210 A1    Sep. 11, 2014

(51) Int. Cl.
*H03L 5/00*     (2006.01)
*H03K 5/156*    (2006.01)
*H03K 3/012*    (2006.01)
*H03K 3/356*    (2006.01)
*H03K 19/017*   (2006.01)
*H03K 19/0185*  (2006.01)

(52) U.S. Cl.
CPC ............. *H03K 5/1565* (2013.01); *H03K 3/012* (2013.01); *H03K 3/35613* (2013.01); *H03K 19/01714* (2013.01); *H03K 19/018521* (2013.01); *H03L 5/00* (2013.01)

(58) Field of Classification Search
CPC .............. H03K 3/356113; H03K 19/018521; H03K 19/00315; H03K 17/102; H03K 3/012
USPC ........................ 327/333, 536–538, 543, 589
See application file for complete search history.

(56) References Cited

U.S. PATENT DOCUMENTS

| | | | |
|---|---|---|---|
| 6,288,591 B1 | 9/2001 | Riccio | |
| 6,326,839 B2 * | 12/2001 | Proebsting | ................. 327/589 |
| 6,844,769 B2 | 1/2005 | Yamamoto et al. | |
| 7,307,454 B1 | 12/2007 | Wert | |
| 7,777,547 B2 | 8/2010 | Luo | |
| 7,800,426 B2 | 9/2010 | Chang | |

(Continued)

FOREIGN PATENT DOCUMENTS

JP      2007311906 A    11/2007

OTHER PUBLICATIONS

Khan, et al., "Reducing system complexity by using a single-supply logic-level shifter," Design Article in EE Times Design, Jul. 1, 2008, retrieved from http://eetimes.com/design/automotive-design/4010060/Reducing-system-complexity-by-using-a-single-supply-logic-level-shifter on Mar. 5, 2013.

(Continued)

*Primary Examiner* — Diana J Cheng
(74) *Attorney, Agent, or Firm* — Patterson & Sheridan, L.L.P.

(57) ABSTRACT

Certain aspects of the present disclosure provide a voltage level shifting circuit employing a low latency, AC-coupled voltage boost circuit, as well as other circuits and apparatus incorporating such a level shifting circuit. Such level shifting circuits provide significantly lower latency compared to conventional level shifters (e.g., latency reduced by at least a factor of two). Offering consistent latency over the simulation corners, level shifting circuits described herein also provide significantly lower power consumption and reduced duty cycle distortion compared to conventional level shifters.

15 Claims, 8 Drawing Sheets

(56) References Cited

U.S. PATENT DOCUMENTS

| | | |
|---|---|---|
| 2002/0180508 A1 | 12/2002 | Kanno et al. |
| 2004/0104756 A1 | 6/2004 | Payne |
| 2007/0001743 A1 | 1/2007 | Wei et al. |
| 2007/0008001 A1 | 1/2007 | Sanchez et al. |
| 2009/0257289 A1* | 10/2009 | Byeon .................. 365/189.09 |

OTHER PUBLICATIONS

Pan, et al., "A Low Voltage to High Voltage Level Shifter Circuit for MEMS Application," Proceedings of the 15th Biennial University/Government/Industry Microelectronics Symposium, 2003, pp. 128-131.

International Search Report and Written Opinion—PCT/US2014/020238—ISA/EPO—Jun. 11, 2014.

Kanno Y., et al., "Level Converters with High Immunity to Power-Supply Bouncing for High-Speed Sub-1-V LSIs", IEEE Symposium on VLSI Circuits Digest of Technical papers, 2000, pp. 202-203.

* cited by examiner

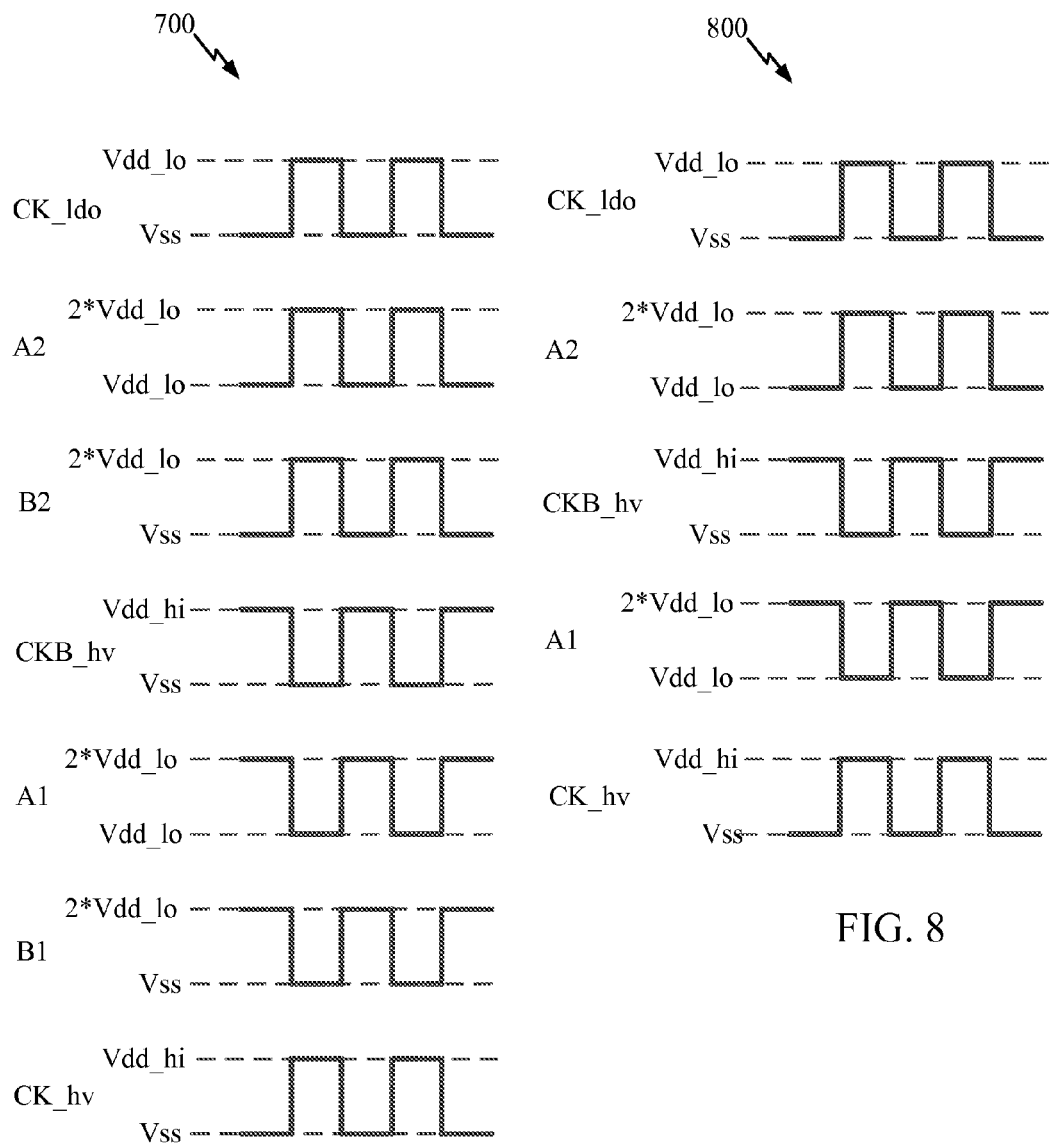

VOLTAGE LEVEL SHIFTER WITH A LOW-LATENCY VOLTAGE BOOST CIRCUIT

TECHNICAL FIELD

Certain aspects of the present disclosure generally relate to electronic circuits and, more particularly, to voltage level shifting circuits.

BACKGROUND

As the minimum feature size of integrated circuits (ICs) continues to shrink and the desire for reduced power consumption persists, the core logic section of digital circuits are being supplied from ever-decreasing voltages, such as down to 1.0 V or lower. However, the power supply voltages of other sections of the IC (e.g., the input/output (I/O) section) may remain at higher voltage levels, such as 1.8 V, 2.5 V, 3.3 V, or higher. These higher voltage levels may be used to interface with other logic types or to assure compatibility with other devices. Therefore, a voltage level shifter is used to level shift a digital input signal from a relatively low supply voltage to a high supply voltage or vice versa.

Voltage level shifters are used in many applications as the interface between low and high voltage control or clock signals. These applications include analog-to-digital converters (ADCs), digital-to-analog converters (DACs), clock level shifters, and any other high-speed interface with multiple supply voltages. An ideal level shifter shifts the input signal to a different level and connects the two interfaces together without any issues, such that the impact of the level shifter is almost negligible. However, conventional level shifters may have high latency, inconsistent performance over various combinations of the voltage levels' extremes, and/or distorted duty cycle in high-speed interface applications.

As an example of a conventional level shifter, U.S. Pat. No. 6,288,591 to Riccio, issued Sep. 11, 2011 and entitled "Level Shifter for Multiple Supply Voltage Circuitry," describes methods and apparatus for shifting from a low voltage input signal to a high voltage output signal. One example level shifter of Riccio includes a voltage shifting stage having first and second control input nodes and an output node at which the output signal is produced based on control signals received at the control input nodes. The level shifter also includes first and second input inverters coupled in series between the input node and the first control input node; and a third input inverter coupled between the input node and the second control input node. The second inverter of Riccio can include complementary first and second transistors, each with control terminals coupled to an output of the first inverter. The first transistor has a first terminal coupled to the input node and is structured to pass the input signal to the first control input node based on a logic value of a signal output by the first inverter. The third inverter can include complementary third and fourth transistors each with control terminals coupled to the input node. The third transistor has a first terminal coupled to the output of the first inverter and is structured to pass the signal output by the first inverter to the second control input node based on a logic value of the input signal.

U.S. Pat. No. 7,777,547 to Luo, issued Aug. 17, 2010 and entitled "Level Shifter for High-Speed and Low-Leakage Operation," also describes example voltage level shifters capable of interfacing between two circuit systems having different operating voltage swings. One example level shifter in Luo includes an input buffer having a low supply voltage for inverting an external input signal to an internal input signal, and an output buffer having a high supply voltage for inverting the internal input signal to an external output signal. The high level of the external input signal is lower than the high level of the external output signal. This voltage level shifter is designed such that the input buffer is operating to achieve a low-leakage and high-speed performance.

SUMMARY

Certain aspects of the present disclosure generally relate to voltage level shifting circuits employing a low latency, low distortion voltage boost circuit. The level shifting circuit may be used to shift a low voltage level signal (e.g., a control or clock signal) to a high voltage level signal in an application with multiple supply voltages.

Certain aspects of the present disclosure provide a circuit for level shifting an input signal from a first voltage level to a second voltage level. The level shifting circuit generally includes an alternating current (AC)-coupled voltage boost circuit configured to boost the input signal such that first and second nodes of the voltage boost circuit have a voltage value greater than or equal to the first voltage level; a first logic inverter configured to produce a first output signal having a magnitude up to the second voltage level, wherein the first node of the voltage boost circuit is coupled to an input of the first logic inverter; and a second logic inverter configured to produce a second output signal having a magnitude up to the second voltage level, wherein the second node of the voltage boost circuit is coupled to an input of the second logic inverter. For certain aspects, at least one of the first or second logic inverter comprises a complementary metal-oxide-semiconductor (CMOS) inverter.

According to certain aspects, the voltage boost circuit generally includes a first capacitor coupled to the first node of the voltage boost circuit and configured to receive a logical inverse of the input signal. The voltage boost circuit may also include a second capacitor coupled to the second node of the voltage boost circuit and configured to receive the input signal.

According to certain aspects, the voltage boost circuit is powered by a third voltage level. The third voltage level may be different than or equal to the first voltage level. For certain aspects, the voltage value of the first and second nodes is between the first voltage level and a sum of the first and third voltage levels, inclusive. If the first and third voltage levels are the same, then the voltage value of the first and second nodes is between the first voltage level and two times the first voltage level, inclusive.

According to certain aspects, the voltage boost circuit includes first and second switches configured, when closed, to connect the third voltage level to the first and second nodes of the voltage boost circuit, respectively. The second node of the voltage boost circuit may be a control for the first switch, and the first node of the voltage boost circuit may be a control for the second switch. For certain aspects, the first and second switches include first and second n-channel metal-oxide-semiconductor field-effect transistors (MOSFETs). A gate of the first transistor (i.e., the first n-channel MOSFET, or NMOS) may be coupled to the second node of the voltage boost circuit, a source of the first transistor may be coupled to the first node of the voltage boost circuit, and a drain of the first transistor may be coupled to the third voltage level. A gate of the second transistor (i.e., the second NMOS) may be coupled to the first node of the voltage boost circuit, a source of the second transistor may be coupled to the second node of the voltage boost circuit, and a drain of the second transistor may be coupled to the third voltage level.

For certain aspects, the drains and sources of certain transistors may be exchanged with one another in the level shifting circuit. For example, the gate of the first transistor may be coupled to the second node of the voltage boost circuit, the drain of the first transistor may be coupled to the first node of the voltage boost circuit, and the source of the first transistor may be coupled to the first voltage level. As another example, the gate of the second transistor may be coupled to the first node of the voltage boost circuit, the drain of the second transistor may be coupled to the second node of the voltage boost circuit, and the source of the second transistor may be coupled to the first voltage level.

According to certain aspects, the second voltage level may be higher than the first voltage level. The first output signal may be a logical inverse of the second output signal for certain aspects. For certain aspects, a logical inverse of the input signal drives another input of the first logic inverter, and/or the input signal drives another input of the second logic inverter.

According to certain aspects, the first or second node of the voltage boost circuit is configured to be initialized to a starting value before the input signal becomes dynamic.

According to certain aspects, the third voltage level is powered by and is configured to track the second voltage level via a tracking circuit. The tracking circuit may include a p-channel MOSFET (PMOS). A source of the PMOS may be coupled to the second voltage level, a drain of the PMOS may be coupled to a gate of the PMOS, and the gate of the PMOS may be coupled to the third voltage level.

According to certain aspects, the level shifting circuit further includes a first switch configured, when closed, to connect the first node of the voltage boost circuit to the input of the first logic inverter; a second switch configured, when closed, to connect the second node of the voltage boost circuit to the input of the second logic inverter; a third switch configured, when closed, to short the input of the first logic inverter to a reference voltage level for the first voltage level; and a fourth switch configured, when closed, to short the input of the second logic inverter to the reference voltage level for the first voltage level. The reference voltage level may be ground, for example. For certain aspects, the input signal may control operation of at least one of the first or third switch, and/or a logical inverse of the input signal may control operation of at least one of the second or fourth switch.

Certain aspects of the present disclosure provide an electronic signal converter, such as an analog-to-digital converter (ADC) (e.g., a delta-sigma ($\Delta\Sigma$) ADC) or a digital-to-analog converter (DAC). The converter generally includes the level shifting circuit as described above. The input signal may be a sampling clock signal for the converter, for example.

Certain aspects of the present disclosure provide an apparatus for wireless communications. The apparatus generally includes at least one transmit circuit or receive circuit, which generally includes the level shifting circuit as described above.

Certain aspects of the present disclosure provide a method of level shifting an input signal from a first voltage level to a second voltage level. The method generally includes boosting the input signal in an AC-coupled voltage boost circuit, such that first and second nodes of the voltage boost circuit have a voltage value greater than or equal to the first voltage level; and outputting, from a first logic inverter, a first output signal having a magnitude up to the second voltage level, wherein the first node of the voltage boost circuit is coupled to an input of the first logic inverter. For certain aspects, the method further includes outputting, from a second logic inverter, a second output signal having a magnitude up to the second voltage level, wherein the second node of the voltage boost circuit is coupled to an input of the second logic inverter.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 illustrates example voltage traces at various nodes in the schematic diagram of FIG. 3 during operation, in accordance with certain aspects of the present disclosure.

FIG. 8 illustrates example voltage traces at various nodes in the schematic diagram of FIG. 4 during operation, in accordance with certain aspects of the present disclosure.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

Example Level Shifting Circuits

Voltage level shifting circuits (or level shifters) are used in many applications as the interface between low and high voltage control or clock signals. These applications include analog-to-digital converters (ADCs), digital-to-analog converters (DACs), clock level shifters, and any other high-speed interface with multiple supply voltages. For example, the transmit and/or receive circuits in a transceiver front end of an access point (AP) or a user terminal may incorporate one or more level shifting circuits, such as in the DACs for transmission or in the ADCs for reception.

Unfortunately, conventional level shifting circuits typically have high latency. In some circuits (e.g., delta-sigma ADCs), such high latency limits the active sampling or amplification time of the ADC. Furthermore, the level shifter latency has extensive variation over the simulation corners (e.g., the various combinations of the maximum and minimum for each of the two different voltage levels in the level shifter, thereby providing four different corners). This variation degrades the consistency of overall performance over the corners. Not only this, but the rise and fall time delays of conventional level shifters are not well aligned, and this distorts duty cycle in high-speed interface applications.

Accordingly, what is needed are level shifting circuits with low latency, low power consumption, low duty cycle distortion, and consistent performance over various operating conditions.

Certain aspects of the present disclosure provide level shifting circuits employing a low latency voltage boost circuit in an effort to solve the latency and/or clock distortion issues. These level shifters have consistent latency over the corners and consume significantly lower power compared to the conventional architectures.

Figure 1:
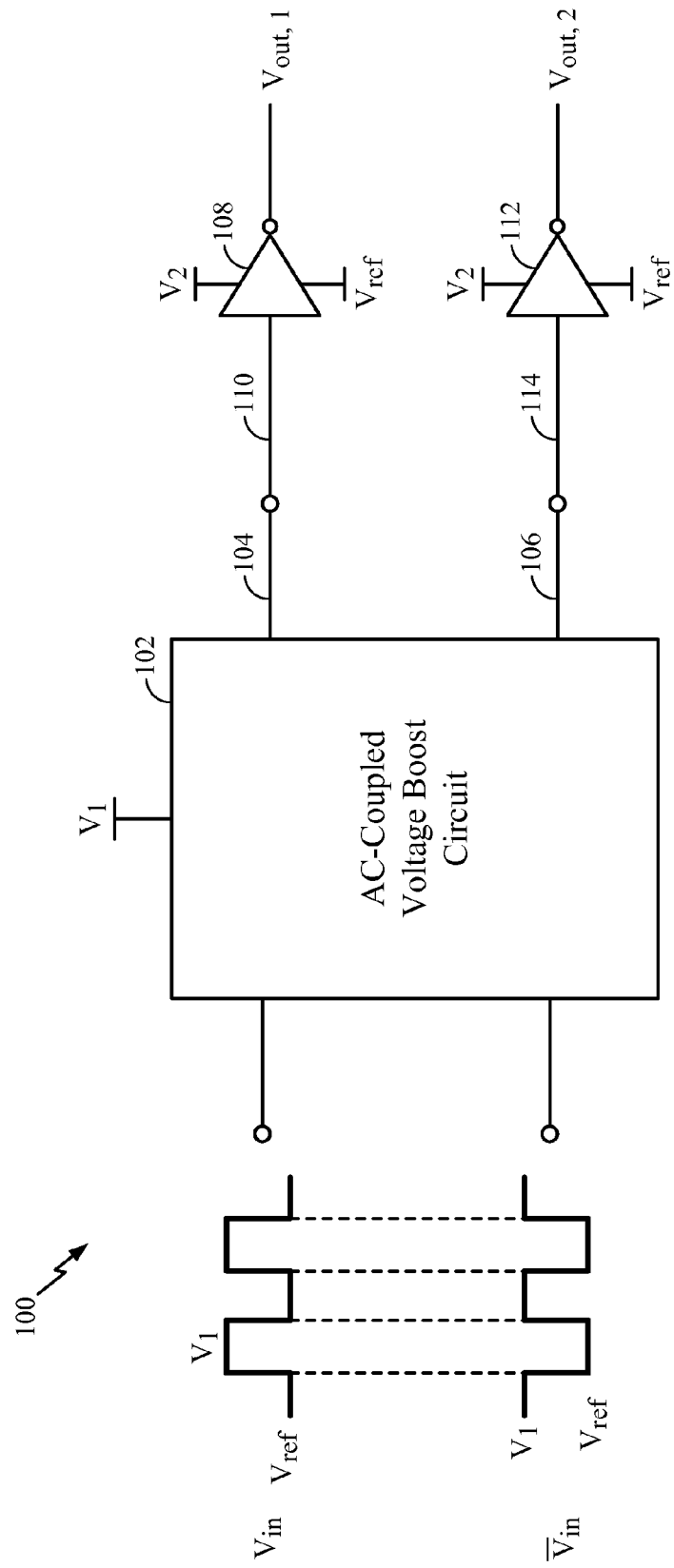
FIG. 1 is a block diagram of an example level shifting circuit with an AC-coupled voltage boost circuit, in accordance with certain aspects of the present disclosure.

FIG. 1 is a block diagram of an example level shifting circuit 100 for shifting an input signal ($V_{in}$) to vary in amplitude from a first maximum voltage level ($V_1$) to a second maximum voltage level ($V_2$), in accordance with certain aspects of the present disclosure. The second voltage level may be higher than the first voltage level. The input signal may vary in amplitude between the first voltage level ($V_1$) and a reference voltage level ($V_{ref}$).

The level shifting circuit 100 generally includes an alternating current (AC)-coupled voltage boost circuit 102, which may be powered by the first voltage level ($V_1$) as shown or by a third voltage level ($V_3$), as described in detail below. The AC-coupled voltage boost circuit 102 is configured to boost the input signal ($V_{in}$) such that first and second nodes 104, 106 of the voltage boost circuit have a voltage value greater than or equal to the first voltage level (e.g., up to two times the first voltage level ($\leq 2V_1$)). The level shifting circuit 100 also includes a first logic inverter 108 configured to produce a first output signal ($V_{out,1}$) having a magnitude up to and including the second voltage level ($V_2$). The first node 104 of the voltage boost circuit 102 is coupled to an input 110 of the first logic inverter 108. The level shifting circuit 100 also includes a second logic inverter 112 configured to produce a second output signal ($V_{out,2}$) having a magnitude up to and including the second voltage level ($V_2$). The second node 106 of the voltage boost circuit 102 is coupled to an input 114 of the second logic inverter 112. For certain aspects, the voltage boost circuit 102 may receive a logical inverse of the input signal ($\overline{V}_{in}$), while in other aspects, the voltage boost circuit or another portion of the level shifting circuit may generate $\overline{V}_{in}$ from the received input signal ($V_{in}$).

Figure 2:
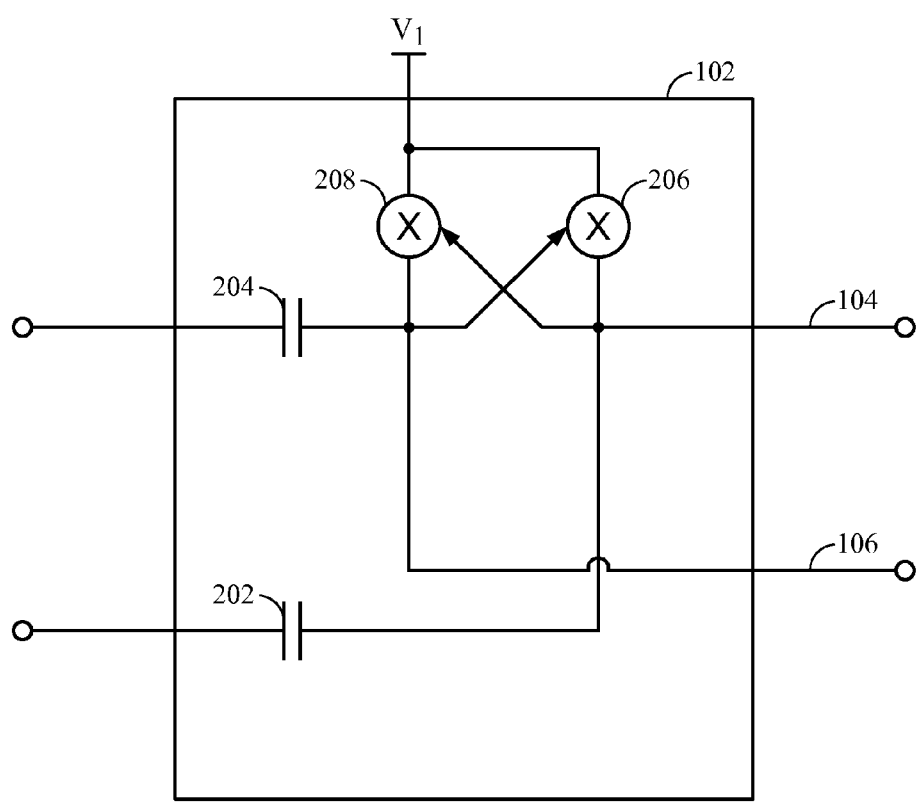
FIG. 2 is a block diagram of an example AC-coupled voltage boost circuit, in accordance with certain aspects of the present disclosure.

FIG. 2 is a block diagram of an example AC-coupled voltage boost circuit 102, in accordance with certain aspects of the present disclosure. The voltage boost circuit generally includes a first capacitor 202 coupled to the first node 104 of the voltage boost circuit. The first capacitor 202 may be configured to receive the logical inverse of the input signal ($\overline{V}_{in}$). The voltage boost circuit 102 also includes a second capacitor 204 coupled to the second node 106 of the voltage boost circuit. The second capacitor may be configured to receive the input signal ($V_{in}$).

The voltage boost circuit 102 also includes first and second switches 206, 208 configured, when closed, to connect the first voltage level ($V_1$) to the first and second nodes 104, 106 of the voltage boost circuit, respectively. The first and second switches may be cross-coupled, such that the second node 106 of the voltage boost circuit 102 is a control for (i.e., controls the opening and closing of) the first switch 206 and the first node 104 of the voltage boost circuit is a control for the second switch 208.

Figure 3:
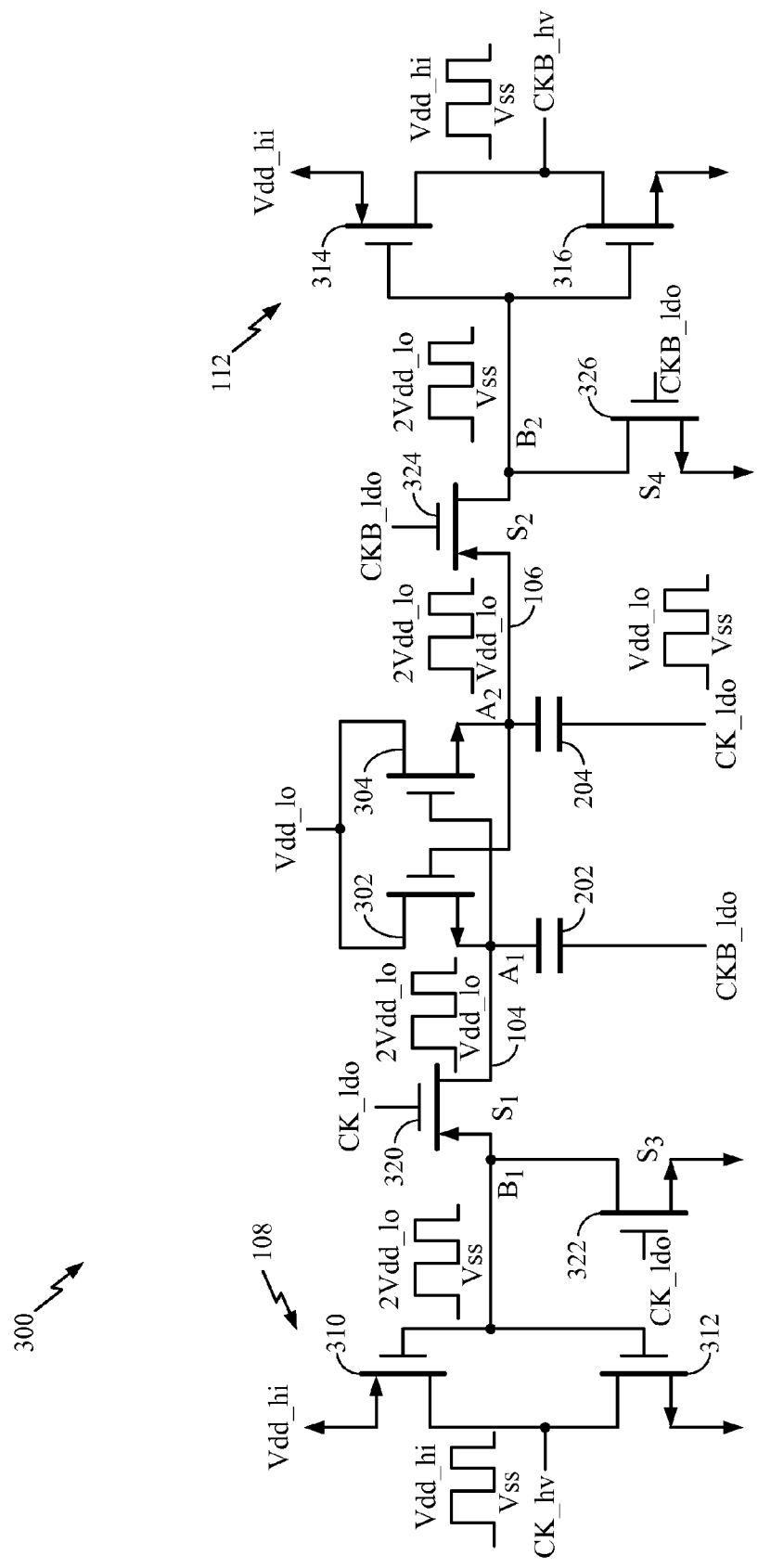
FIG. 3 is a schematic diagram of an example level shifting circuit with an AC-coupled voltage boost circuit in a first configuration, in accordance with certain aspects of the present disclosure.

FIG. 3 is a schematic diagram 300 of an example level shifting circuit, in accordance with certain aspects of the present disclosure. In the schematic diagram 300, an input signal (e.g., low dropout clock signal CK_ldo) is shifted to vary in amplitude from a relatively lower maximum voltage level (designated Vdd_lo, which may have a potential of 0.9, 0.95, or 1.0 V, for example, with respect to Vss or ground) to a higher maximum voltage level (designated Vdd_hi, which may have a potential of 1.65, 1.8, or 1.98 V, for example, with respect to Vss or ground).

In the topology of FIG. 3, the core of the voltage level shifting circuit consists of a very low latency AC-coupled voltage boost circuit. The AC-coupled voltage boost circuit includes two cross-coupled switches 302, 304, which may be n-channel metal-oxide-semiconductor (NMOS) transistors (unlike the PMOS transistors of conventional level shifter topologies). The drains of the two NMOS transistors are connected with the lower voltage level (Vdd_lo). The source of the first NMOS transistor (the first cross-coupled switch 302) is coupled to the gate of the second PMOS transistor (the second cross-coupled switch 304). The source of the second PMOS transistor is coupled to the gate of the first NMOS transistor.

The voltage boost circuit also comprises two capacitors 202, 204. The first capacitor 202 is configured to receive a logical inverse of the input signal (e.g., CKB_ldo) at one end and is coupled to a first node 104 ($A_1$) of the voltage boost circuit at the other end. The first node may also include the gate of the second cross-coupled switch 304 and/or the source of the first cross-coupled switch 302. The second capacitor 204 is configured to receive the input signal (e.g., CK_ldo) at one end and is coupled to a second node 106 ($A_2$) of the voltage boost circuit at the other end. The second node may also include the gate of the first cross-coupled switch 302 and/or the source of the second cross-coupled switch 304.

The outputs of the voltage boost circuit are applied to the logical inverters 108, 112 through switches $S_1$, $S_2$. The switches $S_1$, $S_2$ may be p-channel metal-oxide-semiconductor (PMOS) transistors 320, 324, as illustrated in FIG. 3. In this case, the drain of the first PMOS transistor 320 may be coupled to the first node ($A_1$) of the voltage boost circuit, and its source may be coupled to the input ($B_1$) of the first logical inverter 108. The input signal (e.g., CK_ldo) may be coupled to the gate of the first PMOS transistor 320 and control operation thereof. Symmetrically, the source of the second PMOS transistor 324 may be coupled to the second node ($A_2$) of the voltage boost circuit, and the second PMOS transistor's drain may be coupled to the input ($B_2$) of the second logical inverter 112. The logical inverse of the input signal (e.g., CKB_ldo) may be coupled to the gate of the second PMOS transistor 324 and control operation thereof.

Pull-down switches $S_3$, $S_4$ may be used to pull the inputs $B_1$, $B_2$ of the logical inverters 108, 112 down to ground (or another reference voltage level Vss). As illustrated in FIG. 3, the pull-down switches $S_3$, $S_4$ may be NMOS transistors 322, 326. In this instance, the drain of the first pull-down NMOS transistor 322 may be coupled to the input ($B_1$) of the first logical inverter 108, and the first pull-down NMOS transistor's source may be coupled to a reference voltage level, such as ground. The input signal (e.g., CK_ldo) may be coupled to the gate of the first pull-down NMOS transistor 322 and control operation thereof. Similarly, the drain of the second pull-down NMOS transistor 326 may be coupled to the input ($B_2$) of the second logical inverter 112, and its source may be coupled to a reference voltage level, such as ground. The logical inverse of the input signal (e.g., CKB_ldo) may be coupled to the gate of the second pull-down NMOS transistor 326 and control operation thereof.

The outputs of switches $S_1$, $S_2$ are coupled to the inputs of logical inverters 108, 112 to logically invert the outputs and source/sink current to/from a circuit coupled to the overall outputs (CK_hv and CKB_hv) of the voltage level shifting circuit. Powered by the higher voltage level (e.g., Vdd_hi), but driven by the outputs of switches $S_1$, $S_2$ and of the voltage boost circuit at the lower voltage level (e.g., Vdd_lo), the logical inverters 108, 112 are typically the final stage of the level shifting circuit, providing outputs that can swing up to the higher voltage level.

As shown in FIG. 3, the logical inverters 108, 112 may be complementary metal-oxide-semiconductor (CMOS) inverters. The CMOS inverters typically include at least one PMOS transistor 310, 314 and at least one NMOS transistor 312, 316. When an input to the logical inverter 108, 112 is logical high (H), the NMOS transistor is activated and pulls the output of the logical inverter down to ground, and the PMOS transistor is off. In contrast, when the input to the logical inverter is logical low (L), the PMOS transistor is activated and pulls the output of the logical inverter up to the logical high (H) level (e.g., Vdd_hi), and the NMOS transistor is off.

During operation, the input signal (e.g., CK_ldo) may swing between the reference voltage level (e.g., Vss or ground) and the lower voltage level (e.g., Vdd_lo). For example, if the input signal is a clock, the input clock may alternate between Vss and Vdd_lo at the clocking frequency (with a particular duty cycle), as illustrated in FIG. 7 in the example voltage traces 700 of various nodes in the schematic diagram 300 of FIG. 3. This fluctuating input signal and its logical inverse (e.g., CKB_ldo) will turn on and off cross-coupled switches 302, 304 in an opposing manner through the capacitors 202, 204, thereby bootstrapping the voltages at the first and second nodes to swing between the lower voltage level (e.g., Vdd_lo) and a voltage value greater than the first voltage level, depending on the voltage powering the voltage boost circuit. For example, with the lower voltage level (e.g., Vdd_lo) powering the voltage boost circuit and the input signal, the first and second nodes may have a maximum magnitude of two times the lower voltage level (e.g., 2Vdd_lo).

When a first output of the boost circuit (i.e., the first node) is logic low (L) because the input signal (e.g., CK_ldo) is logic high (H), switch $S_1$ is off, and the input $B_1$ of the first logical inverter 108 is shorted to the reference voltage level with pull-down switch $S_3$. This leads to an overall output of the level shifting circuit at the first logical inverter 108 (e.g., CK_hv) being H. In contrast, when the first output of the boost circuit is H because the input signal is L, pull-down switch $S_3$ is turned off, switch $S_1$ is turned on, and the first output is applied to the input $B_1$, leading to an overall output of the level shifting circuit at the first logical inverter 108 (e.g., CK_hv) being L.

Similarly, when a second output of the boost circuit (i.e., the second node) is logic low (L) because the input signal (e.g., CK_ldo) is L, switch $S_2$ is off, and the input $B_2$ of the second logical inverter 112 is shorted to the reference voltage level with pull-down switch $S_4$. This leads to an overall output of the level shifting circuit at the second logical inverter 112 (e.g., CKB_hv) being H. In contrast, when the second output of the boost circuit is H because the input signal is H, pull-down switch $S_4$ is turned off, switch $S_2$ is turned on, and the second output is applied to the input $B_2$, leading to an overall output of the level shifting circuit at the second logical inverter 112 (e.g., CKB_hv) being L.

With the AC-coupled voltage boost circuit, the level shifting circuit of FIG. 3 provides lower latency and reduced power consumption compared to conventional level shifters. For example, while a conventional level shifting circuit may draw about 60 μA of current, the level shifting circuit of FIG. 3 may draw only about 30 μA for the same voltage levels, thereby cutting the power consumption in half. Comparing latencies on the rising (falling) edge, a conventional level shifting circuit may have a delay of about 106 ps (165 ps), whereas the level shifting circuit of FIG. 3 may have a delay of only about 92 ps (81 ps). Furthermore, with respect to latency variation over the simulation corners, a conventional level shifting circuit may have a rising (falling) edge delay variation of about 190 ps (165 ps), whereas the level shifting circuit of FIG. 3 may have a variation of only about 113 ps (84 ps).

Figure 4:
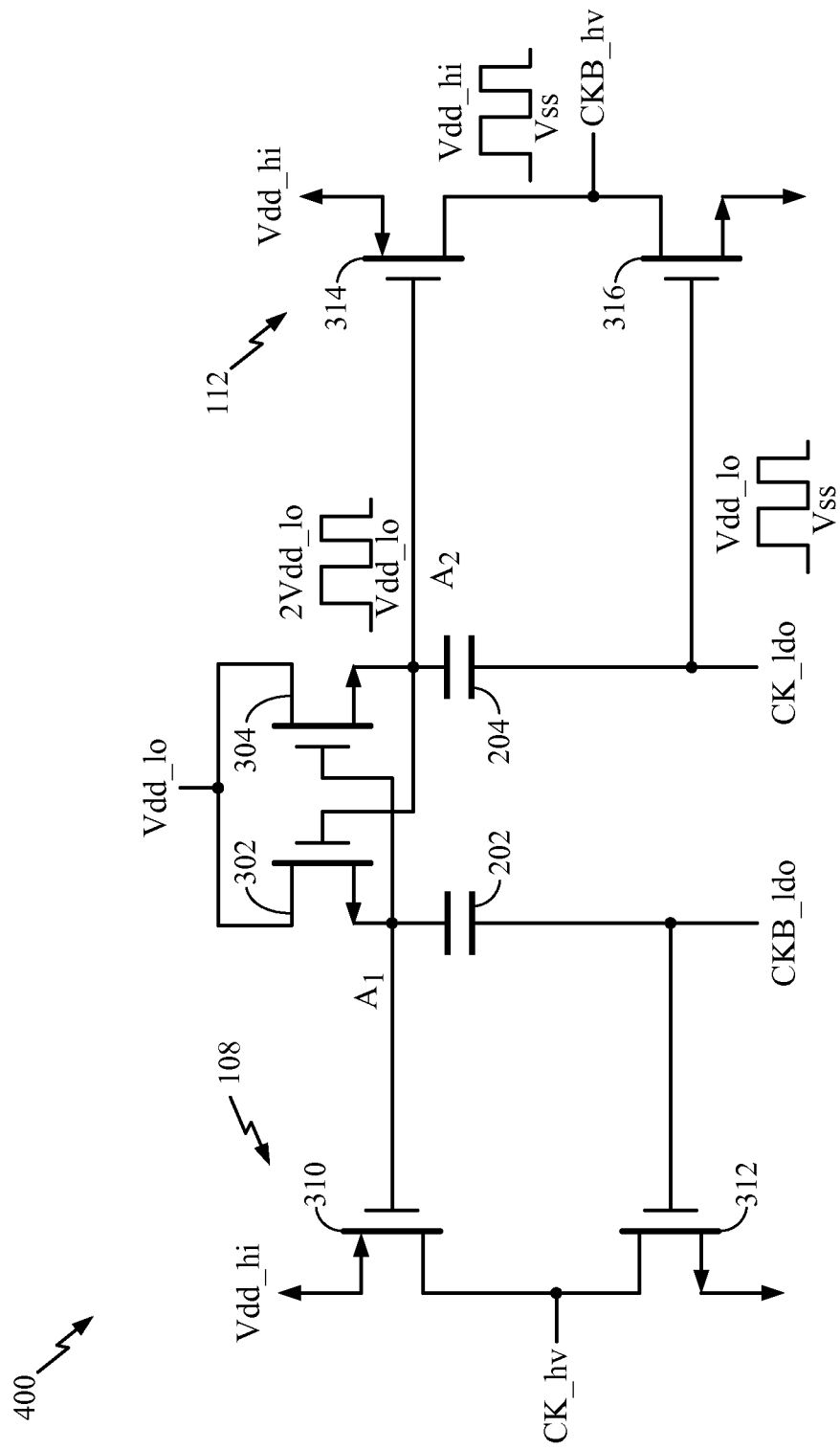
FIG. 4 is a schematic diagram of an example level shifting circuit with an AC-coupled voltage boost circuit in a second configuration, in accordance with certain aspects of the present disclosure.

FIG. 4 is a schematic diagram 400 of an example level shifting circuit with an AC-coupled voltage boost circuit in a second configuration, in accordance with certain aspects of the present disclosure. The topology in FIG. 4 is a simplified version of the level shifting circuit in FIG. 3, where the switches $S_1$-$S_4$ have been removed. Also, the outputs of the voltage boost circuit (i.e., first and second nodes $A_1$, $A_2$) are coupled to the gates of the PMOS transistors 310, 314 in the logical inverters 108, 112 and control operation thereof. As another input to the logical inverters 108, 112, the input signal (e.g., CK_ldo) is coupled to the gate of the NMOS transistor 316, and the logical inverse of the input signal (e.g., CKB_ldo) is coupled to the gate of the NMOS transistor 312, for controlling operation thereof.

FIG. 8 illustrates example voltage traces 800 at various nodes in the schematic diagram 400 of FIG. 4 during operation. The voltage traces 800 are a subset of the voltage traces 700 in FIG. 7, with corresponding nodes exhibiting similar behavior.

With the topology described above, the level shifting circuit of FIG. 4 provides lower latency and reduced power consumption compared to conventional level shifters. For example, while a conventional level shifting circuit may draw about 60 μA of current, the level shifting circuit of FIG. 4 may draw only about 30 μA for the same voltage levels, thereby cutting the power consumption in half. Comparing latencies on the rising (falling) edge, a conventional level shifting circuit may have a delay of about 106 ps (165 ps), whereas the level shifting circuit of FIG. 4 may have a delay of only about 56 ps (61 ps). Furthermore, with respect to latency variation over the simulation corners, a conventional level shifting circuit may have a rising (falling) edge delay variation of about 190 ps (165 ps), whereas the level shifting circuit of FIG. 4 may have a variation of only about 16 ps (53 ps).

Compared to the level shifting circuit of FIG. 3, the level shifting circuit of FIG. 4 provides lower delay (as well as decreased delay variation). However, the circuit of FIG. 4 slows down at extreme simulation corners (e.g., when Vdd_lo and Vdd_hi are changing in opposite directions).

Figure 5:
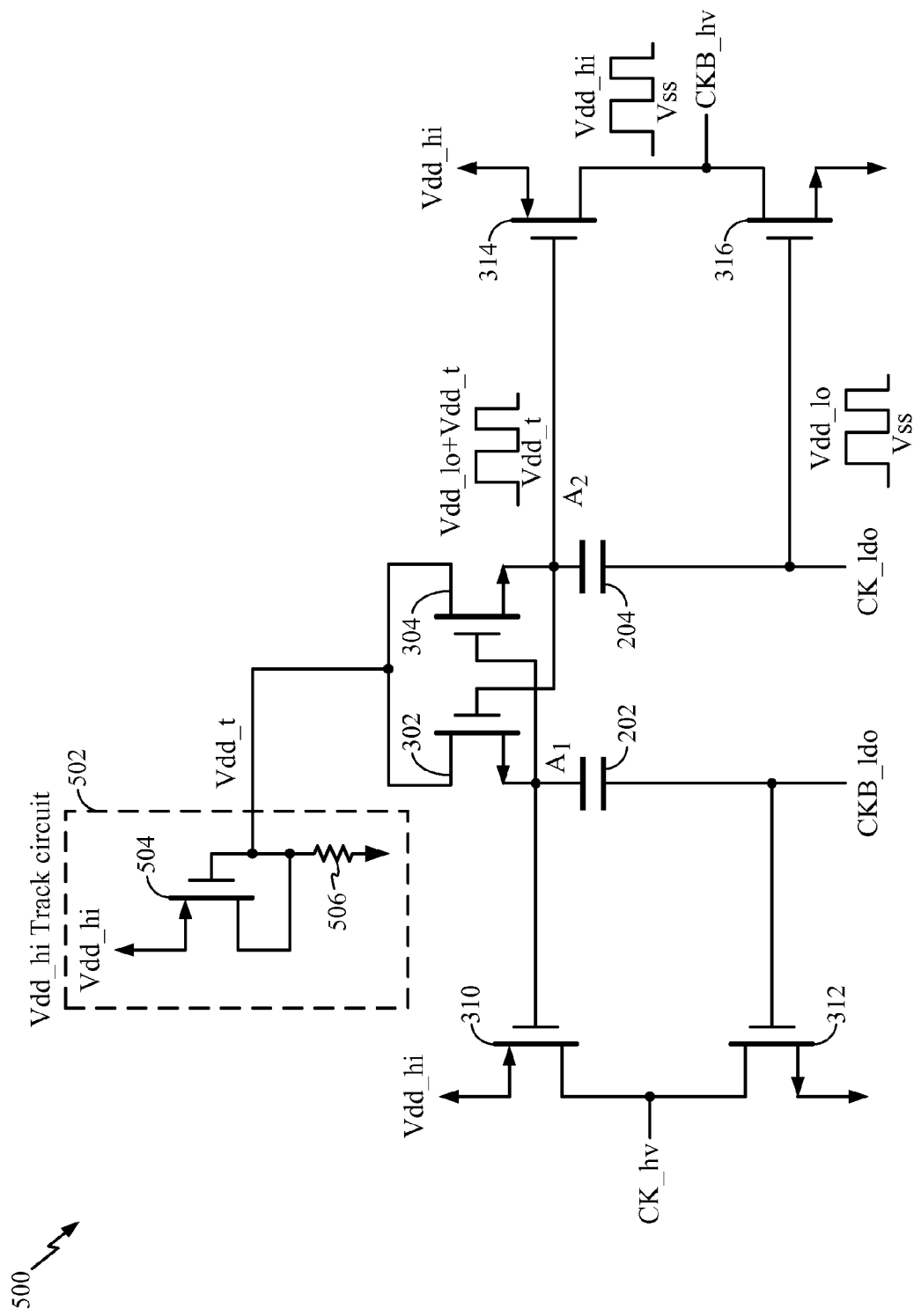
FIG. 5 illustrates an example voltage tracking circuit added to the schematic diagram of FIG. 4, in accordance with certain aspects of the present disclosure.

As an alternative to powering the voltage boost circuit from the first voltage level (e.g., the voltage level of the input signal), the voltage boost circuit may be powered from a third voltage level that tracks the second voltage level (e.g., the voltage level of the overall output of the voltage shifting circuit). The schematic diagram 500 of FIG. 5 illustrates an example voltage tracking circuit 502 added to the schematic diagram 400 of FIG. 4, in accordance with certain aspects of the present disclosure. The voltage tracking circuit 502 outputs a tracking voltage (e.g., Vdd_t) that follows the second voltage level (e.g., Vdd_hi) of the level shifting circuit. In this manner, the variation due to the simulation corners is reduced, since the only variable is the maximum and minimum of the second voltage level (plus the relatively minor variation in the operation of the tracking circuit 502).

As illustrated in FIG. 5, the voltage tracking circuit 502 may include a PMOS transistor 504 whose source is coupled to the second voltage level (e.g., Vdd_hi) and whose drain and gate are coupled together. A resistor may be connected between a reference voltage level (e.g., ground or Vss) and the gate/drain of the PMOS transistor 504, such that the tracking voltage (e.g., Vdd_t) may be established across the resistor 506.

During operation of the level shifting circuit of FIG. 5 with the tracking circuit 502, the first and second nodes may be bootstrapped via the capacitors 202, 204 and the switching operation of the cross-coupled switches 302, 304 to swing between the first voltage level (e.g., Vdd_lo) and the sum of the first and tracking voltage levels (e.g., Vdd_lo+Vdd_t). The level shifting circuit of FIG. 5 has all the advantages of the circuits in FIGS. 3 and 4, with the addition of consistent low delay over all the simulation corners, due to the tracking circuit 502. Furthermore, the level shifting circuit of FIG. 5 provides a balanced rise/fall delay that reduces the duty cycle distortion.

Normal operation of the level shifting circuits described above is delayed until the capacitors 202, 204 are charged up, and it may take several cycles to fully charge the capacitors. However, if the capacitors are initialized with this charge, the level shifting circuit may begin operation rapidly after the input signal (e.g., CK_ldo) and/or its logical inverse (e.g., CKB_ldo) becomes available. Therefore, according to certain aspects, a level shifting circuit may be initialized before the input signal begins to fluctuate (i.e., while the input signal is held constant).

Figure 6:
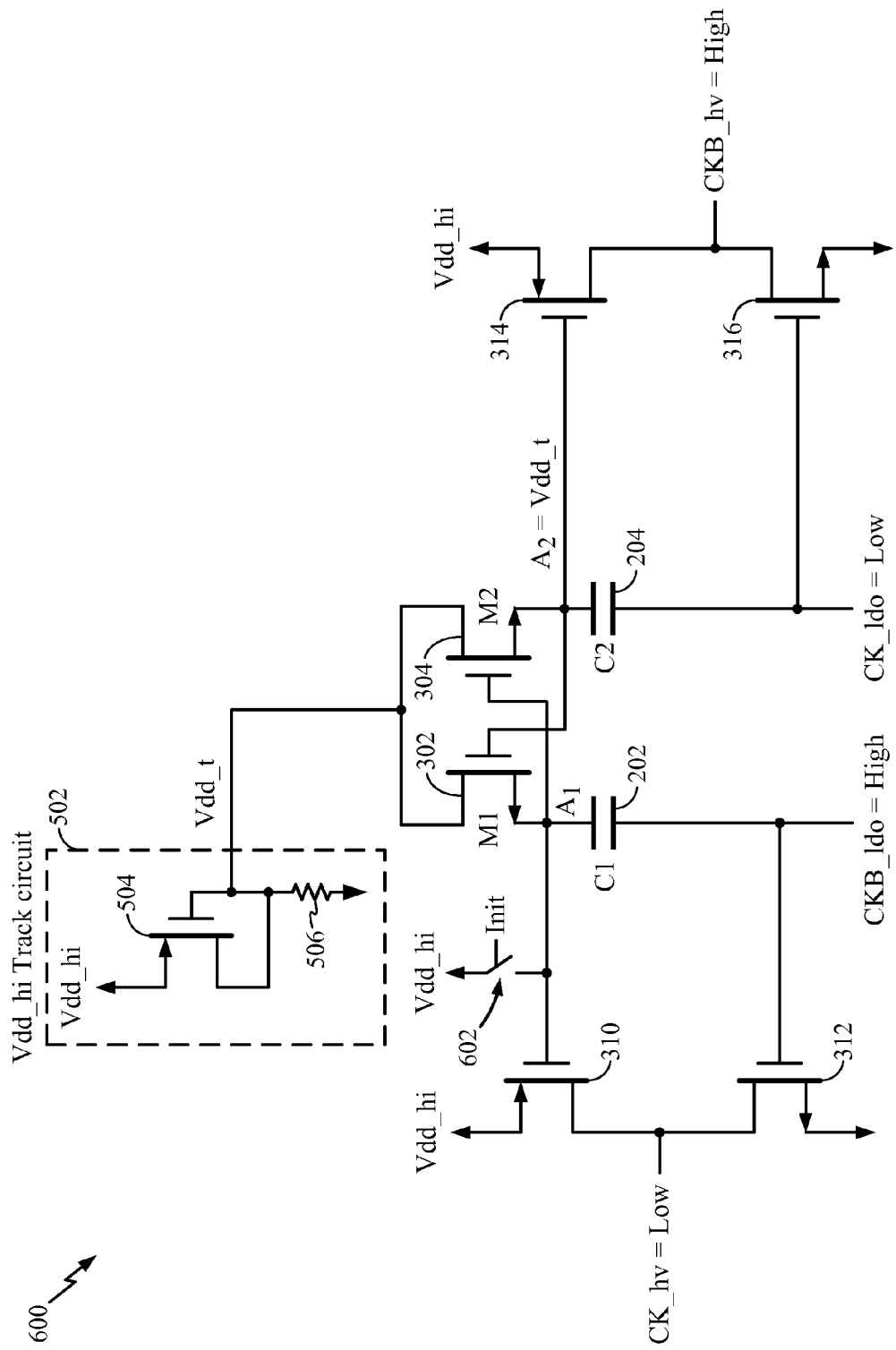
FIG. 6 illustrates an example initialization switch added to the schematic diagram of FIG. 5, in accordance with certain aspects of the present disclosure.

For example, the schematic diagram 600 of FIG. 6 illustrates an example initialization switch 602 added to the level shifting circuit of FIG. 5, in accordance with certain aspects of the present disclosure. The initialization switch 602 may connect the first node 104 (A1)—and the input to the PMOS transistor 310 of the first logical inverter 108—to the second voltage level (e.g., Vdd_hi) during initialization when the switch is closed. The initialization switch 602 may be implemented with any of various suitable switching components, such as a PMOS transistor.

As an example, the input signal (e.g., CK_ldo) may be held to logic low (L), such that the logical inverse of the input signal (e.g., CKB_ldo) is logic high (H). With this setup, the first capacitor 202 will charge up with the second voltage level, and the second cross-coupled switch 304 will turn on, such that the second capacitor 204 will charge up with the tracking voltage (e.g., Vdd_t) applied to it. Thus, the PMOS transistor 314 in the second logical inverter 112 is on, the NMOS transistor 316 is turned off, and the overall output of the voltage level shifting circuit at the second logical inverter 112 (e.g., CKB_hv) is H during initialization, as shown in FIG. 6. Likewise, the PMOS transistor 310 in the first logical inverter 108 is off, the NMOS transistor 312 is turned on, and the overall output of the voltage level shifting circuit at the first logical inverter 108 (e.g., CK_hv) is L during initialization.

After initialization, the initialization switch 602 may be opened, and the input signal (e.g., CK_ldo) may begin to vary in amplitude. From this point, the level shifting circuit of FIG. 6 may resume regular operation as described above with respect to FIGS. 4 and 5.

Any of the voltage level shifting circuits described above may be implemented in analog-to-digital converters (ADCs), digital-to-analog converters (DACs), clock level shifters, and any other high-speed interface with multiple voltage levels (e.g., multiple supply voltages). For example, the transmit and/or receive circuits in the transceiver front end of an access point (AP) or a user terminal may incorporate one or more level shifting circuits, such as in the DACs for transmission or in the ADCs for reception.

Figure 9:
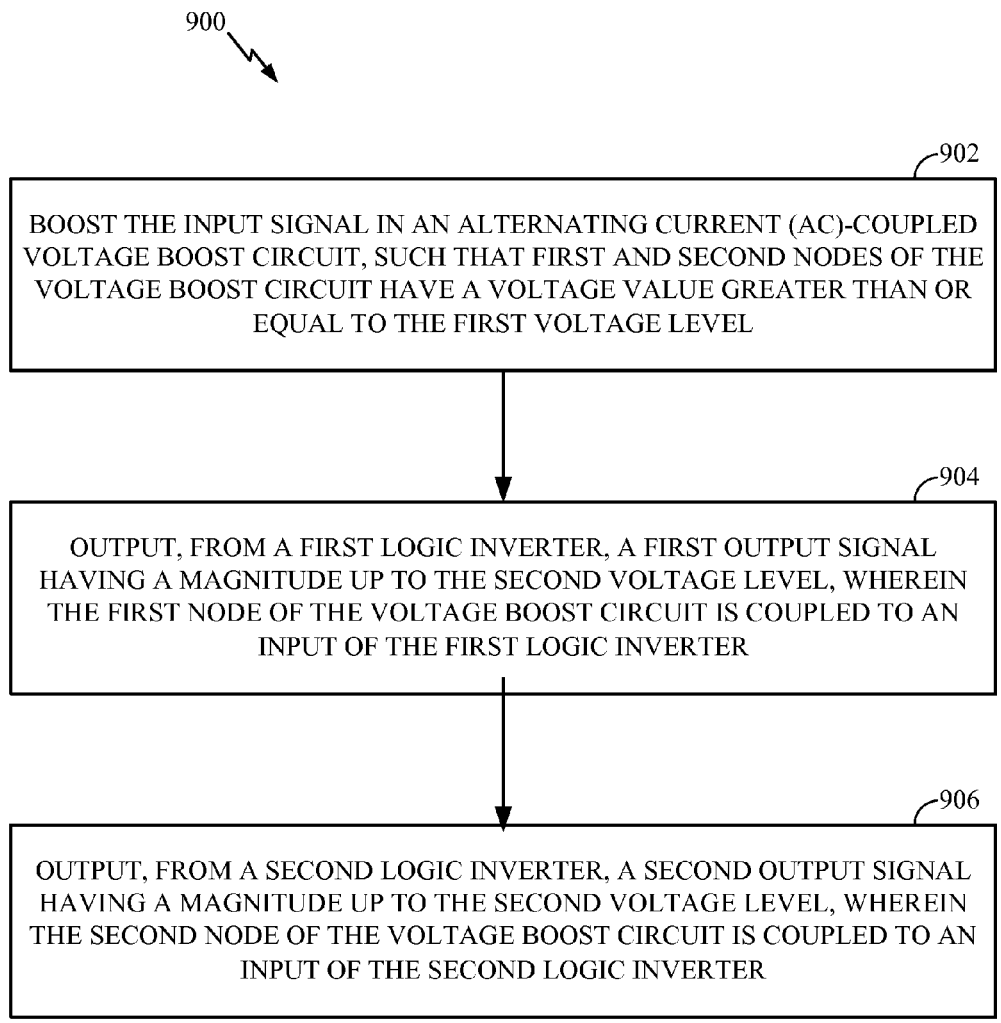
FIG. 9 is a flow diagram of example operations for voltage level shifting an input signal, in accordance with certain aspects of the present disclosure.

FIG. 9 is a flow diagram of example operations 900 for voltage level shifting an input signal, in accordance with certain aspects of the present disclosure. The operations 900 may be performed by any of the voltage level shifting circuits described above. The operations 900 may begin, at 902, by boosting the input signal in an AC-coupled voltage boost circuit, such that first and second nodes of the voltage boost circuit have a voltage value greater than or equal to the first voltage level.

At 904, a first output signal is output from a first logic inverter, where the first node of the voltage boost circuit is coupled to an input of the first logic inverter. The first output signal has a magnitude up to the second voltage level. For certain aspects, a second output signal having a magnitude up to the second voltage level is output from a second logic inverter at 906. The second node of the voltage boost circuit may be coupled to an input of the second logic inverter.

As described above, certain aspects of the present disclosure provide a voltage level shifter with significantly lower latency compared to conventional level shifting circuits (e.g., latency reduced by at least a factor of two). These aspects also have consistent latency over the simulation corners and significantly lower power consumption compared to conventional architectures. Furthermore, the balanced rise/fall delay reduces the duty-cycle distortion compared to conventional circuits.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for level shifting an input signal from a first voltage level to a second voltage level, comprising:
   an alternating current (AC)-coupled voltage boost circuit configured to boost the input signal such that first and second nodes of the voltage boost circuit have a voltage value greater than or equal to the first voltage level;
   a first logic inverter configured to produce a first output signal having a magnitude up to the second voltage level, wherein the first node of the voltage boost circuit is directly connected to an input of the first logic inverter and to a first capacitor configured to receive a logical inverse of the input signal; and
   a second logic inverter configured to produce a second output signal having a magnitude up to the second voltage level, wherein the second node of the voltage boost circuit is directly connected to an input of the second logic inverter and to a second capacitor configured to receive the input signal, wherein the voltage boost circuit is powered by a third voltage level that is lower than the second voltage level, and wherein the first voltage level is equal to the third voltage level.

2. The level shifting circuit of claim 1, wherein the voltage boost circuit comprises first and second switches configured, when closed, to connect the third voltage level to the first and second nodes of the voltage boost circuit, respectively, wherein the second node of the voltage boost circuit is a control for the first switch, and wherein the first node of the voltage boost circuit is a control for the second switch.

3. The level shifting circuit of claim 2, wherein the first and second switches comprise first and second n-channel metal-oxide-semiconductor field-effect transistors (MOSFETs), wherein a gate of the first transistor is coupled to the second node of the voltage boost circuit, wherein a source of the first transistor is coupled to the first node of the voltage boost circuit, wherein a drain of the first transistor is coupled to the third voltage level, wherein a gate of the second transistor is coupled to the first node of the voltage boost circuit, wherein a source of the second transistor is coupled to the second node of the voltage boost circuit, and wherein a drain of the second transistor is coupled to the third voltage level.

4. The level shifting circuit of claim 1, wherein the voltage value of the first and second nodes is between the first voltage level and a sum of the first and third voltage levels, inclusive.

5. The level shifting circuit of claim 1, wherein the third voltage level is powered by and is configured to track the second voltage level via a tracking circuit.

6. The level shifting circuit of claim 5, wherein the tracking circuit comprises a p-channel metal-oxide-semiconductor field-effect transistor (MOSFET), wherein a source of the MOSFET is coupled to the second voltage level, wherein a drain of the MOSFET is coupled to a gate of the MOSFET, and wherein the gate of the MOSFET is coupled to the third voltage level.

7. The level shifting circuit of claim 1, wherein the first or second node of the voltage boost circuit is configured to be initialized to a starting value before the input signal becomes dynamic.

8. The level shifting circuit of claim 1, wherein the logical inverse of the input signal drives another input of the first logic inverter and wherein the input signal drives another input of the second logic inverter.

9. The level shifting circuit of claim 8, wherein the logical inverse of the input signal is directly connected to the other input of the first logic inverter and wherein the input signal is directly connected to the other input of the second logic inverter.

10. The level shifting circuit of claim 1, wherein at least one of the first or second logic inverter comprises a complementary metal-oxide-semiconductor (CMOS) inverter.

11. The level shifting circuit of claim 1, wherein the second voltage level is higher than the first voltage level.

12. The level shifting circuit of claim 1, wherein the second output signal is a logical inverse of the first output signal.

13. An electronic signal converter comprising:
   a circuit for level shifting an input signal from a first voltage level to a second voltage level, the circuit comprising:
      an alternating current (AC)-coupled voltage boost circuit powered by the first voltage level and configured to boost the input signal such that first and second nodes of the voltage boost circuit have a voltage value greater than or equal to the first voltage level;
      a first logic inverter configured to produce a first output signal having a magnitude up to the second voltage level, wherein the first node of the voltage boost circuit is directly connected to an input of the first logic inverter and to a first capacitor configured to receive a logical inverse of the input signal; and
      a second logic inverter configured to produce a second output signal having a magnitude up to the second voltage level, wherein the second node of the voltage boost circuit is directly connected to an input of the second logic inverter and to a second capacitor configured to receive the input signal, wherein the voltage boost circuit is powered by a third voltage level that is lower than the second voltage level, and wherein the first voltage level is equal to the third voltage level.

14. The converter of claim 13, wherein the input signal comprises a sampling clock signal for the converter.

15. A method of level shifting an input signal from a first voltage level to a second voltage level, comprising:
   boosting the input signal in an alternating current (AC)-coupled voltage boost circuit, such that first and second nodes of the voltage boost circuit have a voltage value greater than or equal to the first voltage level;
   outputting, from a first logic inverter, a first output signal having a magnitude up to the second voltage level, wherein the first node of the voltage boost circuit is directly connected to an input of the first logic inverter and to a first capacitor configured to receive a logical inverse of the input signal; and
   outputting, from a second logic inverter, a second output signal having a magnitude up to the second voltage level, wherein the second node of the voltage boost circuit is directly connected to an input of the second logic inverter and to a second capacitor configured to receive the input signal, wherein the voltage boost circuit is powered by a third voltage level that is lower than the second voltage level, and wherein the first voltage level is equal to the third voltage level.

* * * * *